(12) United States Patent
Halope et al.

(10) Patent No.: US 8,172,978 B2
(45) Date of Patent: May 8, 2012

(54) REINFORCED RADIO FREQUENCY IDENTIFICATION DEVICE SUPPORT AND ITS MANUFACTURING METHOD

(75) Inventors: Christophe Halope, Cannes (FR); Olivier Mazabaud, Antibes (FR)

(73) Assignee: Ask S.A., Sophia Antipolis (FR)

( * ) Notice: Subject to any disclaimer, the term of this patent is extended or adjusted under 35 U.S.C. 154(b) by 102 days.

(21) Appl. No.: 12/250,090

(22) Filed: Oct. 13, 2008

(65) Prior Publication Data
US 2009/0095415 A1    Apr. 16, 2009

(30) Foreign Application Priority Data
Oct. 11, 2007   (FR) ..................................... 07 07143

(51) Int. Cl.
| | |
|---|---|
| *B29C 65/52* | (2006.01) |
| *B32B 37/02* | (2006.01) |
| *B32B 37/06* | (2006.01) |
| *B32B 37/14* | (2006.01) |
| *G06Q 30/00* | (2012.01) |
| *G06K 19/063* | (2006.01) |
| *B32B 37/08* | (2006.01) |
| *B32B 37/18* | (2006.01) |
| *G08B 13/14* | (2006.01) |
| *B44C 1/24* | (2006.01) |

(52) U.S. Cl. ..................... 156/307.7; 235/385; 235/492; 235/487; 340/572.7; 340/572.4; 340/572.8; 428/195.1; 428/343; 428/344; 156/291; 156/295

(58) Field of Classification Search .................. 156/291, 156/295, 307.7, 325; 428/195.1, 343, 344, 428/15; 235/492, 487, 385; 340/572.4, 572.7, 340/572.8
See application file for complete search history.

(56) References Cited

U.S. PATENT DOCUMENTS
6,248,199 B1 * 6/2001 Smulson .................. 156/244.12
6,265,977 B1 * 7/2001 Vega et al. ................. 340/572.7
(Continued)

FOREIGN PATENT DOCUMENTS
FR    2782821    3/2000
(Continued)

OTHER PUBLICATIONS
English translation of FR 2782821; Martin, David. Mar. 2000.*

*Primary Examiner* — Sonya Mazumdar
(74) *Attorney, Agent, or Firm* — James C. Lydon

(57) ABSTRACT

The invention concerns a method for manufacturing a radio frequency identification device (RFID), the device featuring an antenna and a chip (12) connected to the antenna, the method including the following steps:
  printing an antenna (12) having contacts (17 and 19) on a support (20) made of paper or synthetic paper,
  placing adhesive dielectric material between the contacts of the antenna,
  positioning an integrated circuit module (10) on the support, the module featuring groups of contacts (17, 18) and the chip (12) connected to groups of contacts inside an encapsulation (14) of the module, so that the groups of contacts of the module are opposite the contacts of the antenna,
  placing a thermoplastic layer (22) and a paper or synthetic paper layer (24) on the support, the two layers (22 and 24) being provided with a recess (21, 23) at the location of encapsulation (14) of the module (10),
  laminating together the three layers, the antenna support layer (20), the thermoplastic layer (22) and the paper or synthetic paper layer (24) in order to electrically connect said module to said antenna and agglomerate the layers (20, 22 and 24) together.

8 Claims, 2 Drawing Sheets

U.S. PATENT DOCUMENTS

| | | | |
|---|---|---|---|
| 6,404,643 B1 | 6/2002 | Chung | 361/737 |
| 6,617,676 B1 | 9/2003 | Oddou et al. | 257/679 |
| 7,688,209 B2 * | 3/2010 | Halope | 340/572.8 |
| 2003/0052177 A1 * | 3/2003 | Halope | 235/492 |
| 2003/0168514 A1 * | 9/2003 | Rancien et al. | 235/492 |
| 2005/0001785 A1 * | 1/2005 | Ferguson et al. | 343/895 |
| 2006/0176181 A1 * | 8/2006 | Halope | 340/572.8 |
| 2006/0285301 A1 * | 12/2006 | Provost et al. | 361/737 |
| 2007/0001859 A1 * | 1/2007 | Kayanakis et al. | 340/572.7 |
| 2007/0252705 A1 * | 11/2007 | Halope et al. | 340/572.8 |
| 2007/0279232 A1 * | 12/2007 | Halope et al. | 340/572.7 |

FOREIGN PATENT DOCUMENTS

FR     2877462     5/2006

* cited by examiner

REINFORCED RADIO FREQUENCY IDENTIFICATION DEVICE SUPPORT AND ITS MANUFACTURING METHOD

TECHNICAL FIELD

This invention concerns radio frequency identification devices designed to be built into objects such as security documents and specifically concerns a reinforced radio frequency identification device support for passport and its manufacturing method.

BACKGROUND ART

Contactless Radiofrequency Identification Devices (RFIDs) are increasingly used for identification of persons moving about in controlled access zones or transiting from one zone to another. A contactless RFID is a device made up of an antenna and a chip connected to the terminals of the antenna. The chip is usually not powered and receives its energy by an electromagnetic coupling between the antenna of the reader and the antenna of the RFID, information is exchanged between the RFID and the reader and particularly information stored in the chip that relates to the identification of the holder of the object on which the RFID is located and to his/her authorization to enter into a controlled access zone.

In this manner, passports can incorporate RFIDs to identify the passport holder. The chip memory contains information such as the identity of the passport holder, his/her country of origin, his/her nationality, visas of different countries visited, dates of entry, restrictions of movements, biometric elements, etc. The RFID device is generally incorporated into the bottom cover board of the passport. An antenna is then printed using ink loaded with conductive particles on the reinforced bottom cover board of the passport cover. The chip is then connected by gluing to the connection terminals of the antenna. Then, the flyleaf of the quire of passport pages is laminated to the back of the reinforced top cover board.

The RFID device can also be manufactured separately from the passport to be incorporated afterwards by gluing between the cover and the bottom flyleaf of the passport, for example. The RFID device featuring the antenna and the chip connected together is then integrated with a paper, plastic or other "inlay".

RFID devices were also developed with an encased chip instead of a bare chip, commonly referred to as integrated circuit module. Recent developments to reduce the size of these modules have actually allowed their integration in passports without increasing the thickness or stiffness of the latter.

The problem of manufacturing a RFID device support integrating a module resides in the connection of the module to the antenna. Actually, traditional connections such as welding for example, used to connect the modules to the copper antennae are not applicable to printed antennas. The connection of the module to the antenna is made between the antenna contacts of the antenna support and the module contacts. Since this connection is made over a small surface, it must be reliable and solid. This connection is made by means of conductive glue in the case of an antenna composed of conductive ink. The making of such a connection requires the following manufacturing steps:
  printing an antenna featuring contacts on a support,
  depositing spots of conductive glue on antenna pads,
  installing the electronic module on spots of conductive glue,
  cross-linking of the conductive glue by passing through an oven.

Then, the traditional lamination step of various layers that make up the card is carried out by hot press molding, generally the lower and upper card body on either side of the antenna support.

Such a connection has drawbacks. When conductive glue is applied, short-circuits with the module could occur. Furthermore, spots of conductive glue that harden during cross-linking are likely to crack the contacts of the antenna under the pressure exerted during the lamination step or else during jerks and impacts exerted on the passport. The final risk then being the breakage of the electrical contact between the antenna and the integrated circuit module and thus permanent damage to the radiofrequency identification device.

SUMMARY OF THE INVENTION

This is why the purpose of the invention is to counter these drawbacks by offering a manufacturing method of a radiofrequency identification device enabling to ensure a reliable connection between the integrated circuit module and the antenna.

Another object of the invention is to provide an identity booklet such as a passport integrating such a radio frequency identification device without any visible mark of the chip on the outside of the booklet's cover.

The purpose of the invention is therefore a manufacturing method of a radio frequency identification device (RFID), the device featuring an antenna and a chip connected to the antenna, the method including the following steps:
  printing an antenna featuring contacts on a paper or synthetic paper support,
  placing adhesive dielectric material between the contacts of the antenna,
  positioning an integrated circuit module on the support, the module featuring groups of contacts and the chip connected to groups of contacts inside an encapsulation of the module, so that the contacts of the module are opposite the contacts of the antenna,
  placing on the support a thermoplastic layer and a paper or synthetic paper layer, the two layers being provided with a recess at the location of encapsulation of the module,
  laminating together the three layers, the antenna support layer, the thermoplastic layer and the paper or synthetic paper layer in order to electrically connect the module to the antenna and agglomerate the layers together.

BRIEF DESCRIPTION OF THE DRAWINGS

The purposes, objects and characteristics of the invention will become more apparent from the following description when taken in conjunction with the accompanying drawings in which.

DETAILED DESCRIPTION OF THE INVENTION

Figure 1:
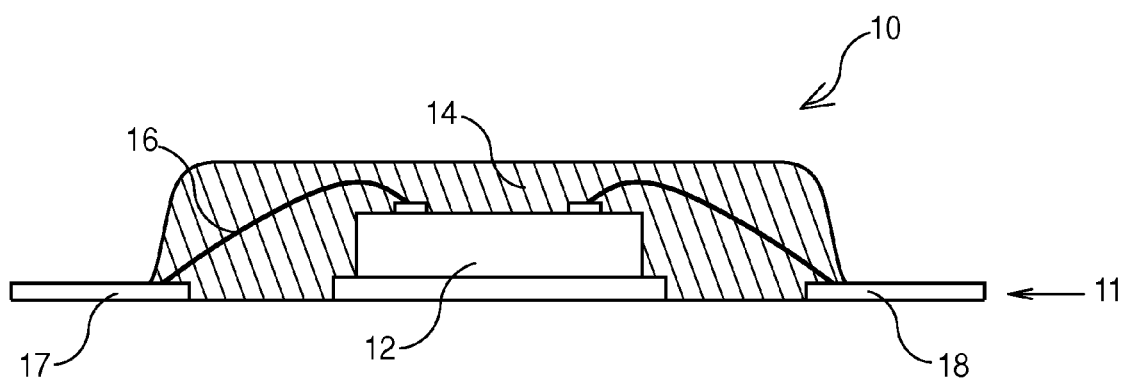
FIG. 1 represents a section of the electronic module.

According to FIG. 1, the integrated circuit module features a chip 12, at least two groups of contacts 17 and 18. The connections between the chip and the groups 17 and 18 are made by very small conductive wires or connecting cables, referred to as "wire bonding" in English. The chip 12 and the wires are encased in a resistant material-based protective resin 14 that does not conduct electricity. The encapsulation 14 is in a way a stiff shell that includes the chip and its wiring in order to make it less fragile and easier to handle. The encapsulation has a thickness between 200 and 240 μm. The module thus presents on its upper face a flat surface corresponding to the upper portion of the encapsulation 14 and on its lower face groups of contacts 17 and 18 designed to connect to a circuit. The groups 17 and 18 are made of conductive material such as aluminum and their thickness is between 70 and 100 μm.

According to the first step of the manufacturing method, an antenna is made on a support layer 20. The antenna features a set of one or more turns. The turns are made by screen printing, flexography, rotogravure, offset printing or inkjet printing with epoxy type conductive ink loaded with conductive particles such as for example silver or gold or with a conductive polymer. The support layer 20 is a material that does not melt such as paper or synthetic paper. The paper is made up of pulped plant fibers and as a result has a fibrous structure. The core of the paper tends to delaminate when it is subjected to shear stresses, whereas non fibrous synthetic paper has a microporous structure and has a low density. Like paper, synthetic paper simplifies the lamination operation carried out at temperatures in the order of 160° C., as it is stable at these temperatures; unlike thermoplastic materials such as PVC or PETG, it does not creep. The synthetic paper used consist of one single non-oriented layer of a polymer such as polyethylene or polypropylene loaded with minerals between 40 and 80%. Its composition gives it a low density in the order of 0.57 g/cm$^3$ by means of its microporous network. The thickness of the support layer is preferably between 140 and 180 μm.

Figure 2:
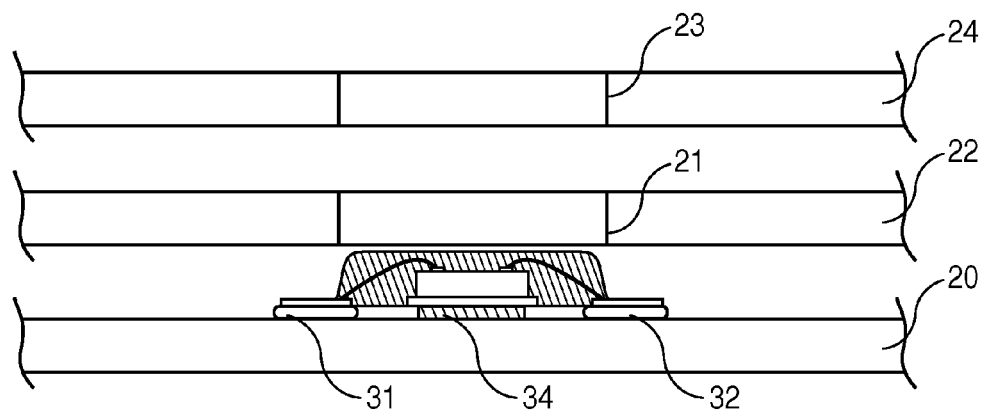
FIG. 2 represents the various layers that make up the RFID device support before lamination.

The module 10 shown in FIG. 2 is designed to connect to the antenna on contacts. As part of the invention, only two contacts 31 and 32 are sufficient to connect the module. The contacts 31 and 32 are the continuity of the antenna; as a result they are in the extension of turns of the antenna and are generally made of the same material as the antenna. The contacts are thus also made by screen printing, flexography, rotogravure, offset printing or inkjet printing with epoxy type conductive ink loaded with conductive particles such as for example silver or gold or with a conductive polymer. The thickness of contacts is between 5 and 10 μm. The ink used in the manufacturing of contacts is flexible and non-elastic. It is therefore possible that the ink used for antenna contacts is different from the ink used to manufacture the rest of the antenna.

The module shown in FIG. 2 is glued to the layer of the antenna support 20 by means of adhesive material 34 so that the groups of contacts 17 and 18 of the module are opposite the contacts 31 and 32 of the antenna. The module is placed on the antenna support layer once the ink constituting the contacts is dry and the adhesive material is applied. The gluing of the module on the antenna support layer is necessary to maintain and fix the module in position during the entire duration of the manufacturing method. The adhesive material used is a glue that secures the module to the support layer 20. Cyanoacrylate type glue is used. It is also possible to use a film-type "hot-melt" adhesive used in cards and which is placed under the module prior to insertion in the card. This gluing is not used as the electrical connection between the support and the antenna.

The various layers that make up the RFID device support are then installed on the antenna support for the lamination step. A first layer of thermoplastic 22 is positioned directly on the antenna support layer 20. The thermoplastic material used for the layers 22 is preferably polyvinyl chloride (PVC), but could also be polyester (PET, PETG), polypropylene (PP), polycarbonate (PC) or acrylonitrile-butadiene-styrene (ABS) or a polyurethane (PU) film. The thickness of the thermoplastic layer 22 is between 100 and 160 μm. The layer 22 features a recess 21 whose dimensions are close to dimensions of the flat surface of the upper part of the encased portion of the module. In this manner, the edges of the recess match the edges of the encased portion of the module. In this way, when the layer 22 is in place on the layer of the antenna support 20, the module 10 is located in the recess 21. A second layer 24 is positioned on the first layer 22. The layer 24 is made of synthetic paper or paper as described for the layer of the antenna support 20. The layer 24 also features a recess 23 preferably of the same size as the recess 21. When all layers are installed for the lamination step, the recesses 21 and 23 overlap.

The last manufacturing step of the RFID device support consists in laminating together the 3 layers, the layer of the antenna support 20, the thermoplastic layer 22 and the layer 24 of paper or synthetic paper. The lamination step consists in subjecting all layers to an increase in temperature up to 150° C. and an increase in pressure up to 20 bar followed by a lowering of temperature and lowering of pressure, the whole lot according to a set of cycles of defined duration. The lowering of ambient temperature is done preferably at constant pressure, then pressure is reduced. During lamination, the PVC of layer 22 fluidizes and traps the antenna and the module. The pressure exerted during the lamination is directed perpendicular to the layers and thus perpendicular to the groups of contacts 17 and 18.

Figure 3:
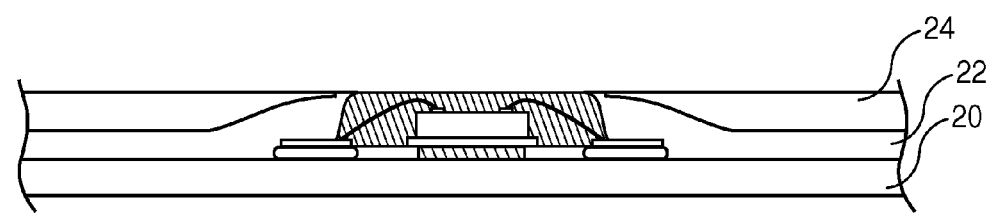
FIG. 3 represents a section of the RFID device support.

FIG. 3 shows a cross-section of the module and the 3 layers near the module after the lamination step. During the lamination step, the three layers that make up the RFID device support reduce in thickness. In this manner, the layers 20 and 24 of paper or synthetic paper lose approximately 22% of their thickness. For example, a layer 20 or 24 initially 180 μm thick has a thickness of 140 μm after lamination. The thermoplastic layer 22 reduces its thickness by 55%.

During the lamination, a pressure is exerted on the entire module. The groups of contacts of the module press on the contacts of the antenna causing a deformation of contacts and the support layer 20. This deformation is in the form of an imprint whose inner surface exactly matches the outside surface of the groups of contacts. In this manner, there exists an intimate contact between the groups of contacts of the module and the conductive ink of contacts 18 over a maximum contact surface. The material which makes up the support layer 20, as well as the conductive ink of the contacts 18, being deformable and non-elastic, these two materials do not tend to return to their original shape even when the pressure is released.

Furthermore, during the lamination, the softened thermoplastic of layer 22 has completely matched the contours of the module and internal surfaces of layers 20 and 24 situated on either side of the layer 22. The thermoplastic acts as a glue between the layers 20 and 24 so that, once hardened, it adheres completely to both layers and to the module. The two layers 20 and 24 on either side of the thermoplastic layer are stressed under the effect of pressure during lamination and the stress applied is maintained on the groups of contacts of the module so that the electrical contact between the module and the antenna is permanent and reliable once the thermoplastic of layer 24 has hardened. The lamination step thus enables to electrically connect the module to the antenna and agglomerate the layers 20, 22 and 24 together. In this manner, when compared with the installation of a bare chip by the method known as "flip-chip" where the chip is electrically connected to the antenna as soon as it is installed between the antenna contacts, the positioning step of the module enables only to maintain the latter mechanically between the contacts. The module is electrically connected to the antenna by means of the method implemented combined with the materials used. As a result, the layers 20 and 22 of paper or synthetic paper pinch the module at the location of groups of contacts and contacts of the antenna and the pinch effect is maintained by means of the thermoplastic layer 22, which, once cooled has hardened.

The pressure exerted on the encased and stiff portion of the module tends to further compress the portion of the support layer 20 on which it presses, thus the one situated just below. This effect tends to make the RFID device support of equal thickness over its entire surface. In this manner, once inserted in the passport cover, the location of the module is invisible.

The manufacturing method according to the invention gives a reliable and resistant radiofrequency identification device. This advantage is significant for the use of the device in a secure document such as a passport. As a result, the passport pages and consequently the cover supporting the RFID device will be subjected to impacts from stamping or affixing of endorsements, which exposes the electronic chip to a significant risk of destruction. In addition, the electrical connection between the module and the antenna does not have any rigid element immobilizing the module with respect to the antenna such as welding or conductive adhesive and as a result is more solid and more reliable.

The invention claimed is:

1. A method for manufacturing a radio frequency identification device (RFID), said device featuring an antenna and a chip connected to the antenna, said method including the following steps:

printing an antenna having contacts on an antenna support made of paper or synthetic paper, placing adhesive dielectric material between said contacts of the antenna, positioning an integrated circuit module on said antenna support, said module comprising groups of contacts and a chip connected to groups of contacts inside an encapsulation of the module, so that the groups of contacts of said module are opposite said contacts of said antenna, placing on said antenna support a thermoplastic layer and a paper or synthetic paper layer, the thermoplastic layer and the paper or synthetic paper layer each being provided with a recess at the location of the module, laminating together the antenna support, the thermoplastic layer and the paper or synthetic paper layer in order to electrically connect said module to said antenna, such that the antenna support layer and the paper or synthetic paper layer pinch the module at the location of groups of contacts and contacts of the antenna, with the pinch being maintained by the thermoplastic layer which, after the lamination step, has hardened.

2. The manufacturing method according to claim 1 in which the shapes of recesses are such that they match a form of the encapsulation.

3. The manufacturing method according to claim 1, in which the recess of the thermoplastic layer and the recess of the paper or synthetic paper layer have the same size.

4. The manufacturing method according to claim 1, in which an adhesive dielectric material is placed on said support between the connections of said antenna, before the chip is positioned, so as to maintain said module in a fixed position relative to the support.

5. The manufacturing method according to claim 1 in which the adhesive material applied to the antenna support is a cyanoacrylate glue.

6. The manufacturing method according to claim 1, wherein the contacts of said antenna are flexible.

7. The manufacturing method according to claim 1 in which, during the lamination step, cooling is done under pressure.

8. The manufacturing method according to claim 1, wherein the positioning step maintains the module between the antenna contacts only mechanically.

* * * * *